United States Patent
Backhaus

(10) Patent No.: US 6,645,337 B1
(45) Date of Patent: Nov. 11, 2003

(54) TECHNIQUE FOR PARTIALLY JOINING COPPER FOILS AND SEPARATOR SHEETS

(75) Inventor: Dieter Backhaus, Paradies (DE)

(73) Assignee: Copper to Copper, LLC, Atkinson, NH (US)

(*) Notice: Subject to any disclaimer, the term of this patent is extended or adjusted under 35 U.S.C. 154(b) by 67 days.

(21) Appl. No.: 09/613,089

(22) Filed: Jul. 10, 2000

Related U.S. Application Data

(63) Continuation of application No. PCT/DE99/02122, filed on Jul. 5, 1999.

(30) Foreign Application Priority Data

Jul. 14, 1998 (DE) .......................... 198 31 461

(51) Int. Cl.⁷ .................. B32B 15/02; B32B 15/20
(52) U.S. Cl. .............. 156/252; 156/256; 156/298; 156/300; 156/299
(58) Field of Search ................. 156/252, 233, 156/256, 297, 298, 299, 300, 288

(56) References Cited

U.S. PATENT DOCUMENTS 5,160,567 A * 11/1992 Konicek et al. ............ 156/288
5,725,937 A * 3/1998 Johnston ..................... 428/209
6,127,051 A * 10/2000 Frater ........................ 428/677

* cited by examiner

Primary Examiner—Richard Crispino
Assistant Examiner—George R Koch, III
(74) Attorney, Agent, or Firm—Pierce Atwood; Kevin M. Farrell

(57) ABSTRACT

This technique involves joining copper foils of any type and thickness to aluminum sheets of any alloy and thickness in order to simplify the assembly of multilayer press books, whereby two copper foils of any type and thickness and one aluminum sheet of any alloy and thickness are joined in such a way that the joint is located outside the surface of the aluminum separator. At the same time, the registration slots required for the multilayer press can be punched. The selected copper foil panels.are slightly larger than the aluminum sheet. When the aluminum separators thus covered with a copper foil on both sides are subsequently placed into the press together with the epoxy resin fabrics (prepregs) for laminating the multi-layer, the aluminum sheet can expand unhindered during heating without causing any surface tension on the copper foils. As soon as the epoxy resin liquefies, surplus resin can run off along the projecting edges of the oversize copper foil without coming into contact with the aluminum sheet and without contaminating the edges of the press books. The projecting copper foil with the surplus resin can then easily be cut off along the edges of the aluminum separator.

7 Claims, 2 Drawing Sheets

TECHNIQUE FOR PARTIALLY JOINING COPPER FOILS AND SEPARATOR SHEETS

This application is a Continuation of PCT International Application No. PCT/DE99/02122 filed on Jul. 5, 1999.

FIELD OF THE INVENTION

The invention relates to the field of joining copper foils and separator sheets for pressing multilayers.

BACKGROUND OF THE INVENTION

It is known that the outer layers of a multilayer coming off the press consist of a full-size copper foil which is laminated to the underlying prepreg (a glass fabric reinforced with epoxy resin). The final image pattern is then etched off these foils at a later stage. To be able to do this, it is important (for the end-user) to have a copper foil that is totally fee from defects like dents, scratches and bumps. Such an even surface can only be achieved by using separator sheets with a completely smooth surface. This also enables several books to be pressed at one time.

Lamination of multilayers takes place in multi-daylight or vacuum presses, whereby the copper foil is laminated to the prepreg at about 180° C. under pressure, thus forming an inseparable compound with the inner layers.

According to DE 38 44 498 A1, distortion of the laminated multilayers causing an uneven copper surface can be avoided if the lamination is carried out using a vacuum in combination with an isostatic pressing technique. For this, additional floating plates are inserted which are thermally insulated to keep the press plates cool when the multilayer is heated.

A disadvantage of this technique is that each book (on each of the floating sheets) must be the same size and thickness, which means that the edges of the multilayer can be easily contaminated by the epoxy resin flowing out during heating.

According to DE 35 07 568 C2, a gliding protector is to keep the prepreg layers in position. However, this can only work if oversize copper foils are used so that the resin can run off on them. The disadvantage here is that this technique uses stainless steel. Since stainless steel is a poor conductor of heat, it takes more time and thus requires more energy to heat the books. Moreover, the heat distribution is worse and less uniform than in the case of aluminum, for example.

The technique according to DE 41 16 543 A1 uses a steel sheet separator with a thermal expansion value increased to $16 \times 10^{-6}$ C per degree Celsius to bring it close to the expansion value of copper. This certainly minimizes surface tension, but the disadvantage of a longer heating time still remains.

As a consequence, aluminum sheets are used more and more frequently instead of steel, since aluminum conducts the heat better and more evenly than steel.

A further disadvantage of all the techniques described above is that each book has to be assembled in a lay-up room by specially trained staff, whereby each copper foil and separator must be combined with the other layers manually one by one (see Manfred Huschka, "Einführung in die Multilayer-Preßtechnik", Eugen G. Leuze Verlag 1988, chapter 3). Delicate, ultra thin copper foils, in particular, are easily damaged when handled in this way.

The technique according to DE 31 31 688 A1 merely describes the production of a copper-aluminum compound, making no mention at all of the separate handling of the copper foils.

During the subsequent lamination process, there is also a danger of considerable surface tension occurring as a result of the bonding and, in particular, the different thermal expansion values of copper and aluminum, which means that the aluminum starts to expand much earlier than the copper. Moreover, liquid epoxy resin may also contaminate the edges of the books in this case.

The technique described in U.S. Pat. No. 5,160,567 also deals with the production of laminates. Here, the stainless steel plates are covered with an oversize copper foil on both sides in a first step, then the foils are joined to each other along the edges of the plate.

This technique, too, has its disadvantages, as the heat conduction and distribution is worse (and more uneven) than in the case of aluminum, which means that more heating time is required. Moreover, the copper foils also have to be applied manually one by one. Especially when using ultra-thin foils, however, this can hardly be done without kinking/damaging the foils.

SUMMARY OF THE INVENTION

The invention is therefore based on the task of developing a technique that prevents or largely avoid both the sticking together of the various books and a deformation of the copper foils as easily caused if additional operations are required.

This task is achieved in the invention by the features as follows. Copper foils of any give type and thickness with aluminum separators of any give alloy and thickness can be connected together for use in laminating multi-layers by placing the copper foil panel on both sides of the aluminum separator. The copper foils are larger than the aluminum separator so that the copper foils project beyond the edges of the aluminum separator on all sides. Further the copper foils lie flat on the aluminum separator. Fixing the oversized and projecting copper foils to each other in such a manner that there is a free space between the fixation points and aluminum separator allows the separator to expand and, as noted above, prevents deformation of the copper foils. Subsequent punching of registration slots can be provided if required.

DETAILED DESCRIPTION OF THE INVENTION

This method avoids the separate handling of the copper foils when assembling the book and thus eliminates the danger of kinking/damaging them. The foils stay flat on the separator, which means that ultra-thin copper foils can be used as well. If registration slots are punched in line (i.e. directly after fixing the foils), this prevents movements and possible damage to the foils during additional handling (as required if these holes have to be punched at a later stage).

To prepare the book for the lamination cycle, just one further operation is therefore necessary to put the foil-covered and punched separator in position on the prepreg.

During the lamination process, the aluminum separator can expand unhindered and may even break through the glue line without causing tension on the copper surface. Any epoxy resin flowing off will be accommodated by the projecting copper foil, as it can run along the edge of the foil and is thus prevented from coming into contact with the aluminum separator.

The projecting copper foil with the surplus resin can then be easily cut off along the edges (and thus outside the surface) of the separator. If the two copper foils have been joined mechanically, for example by punching or stamping, this enables the separator to expand unhindered and results in a more even resin flow as there is now no tension on the surface.

Gluing the edges of the two projecting copper foils together assures a longer duration of the bond, thus enabling the copper foil-covered separators to be stored for a longer period.

Thermal bonding of the two copper foils (e.g. by soldering or welding) produces the same results, also allowing the separator to expand unhindered. Which bonding technique to use primarily depends on the costs involved.

Figure 1:
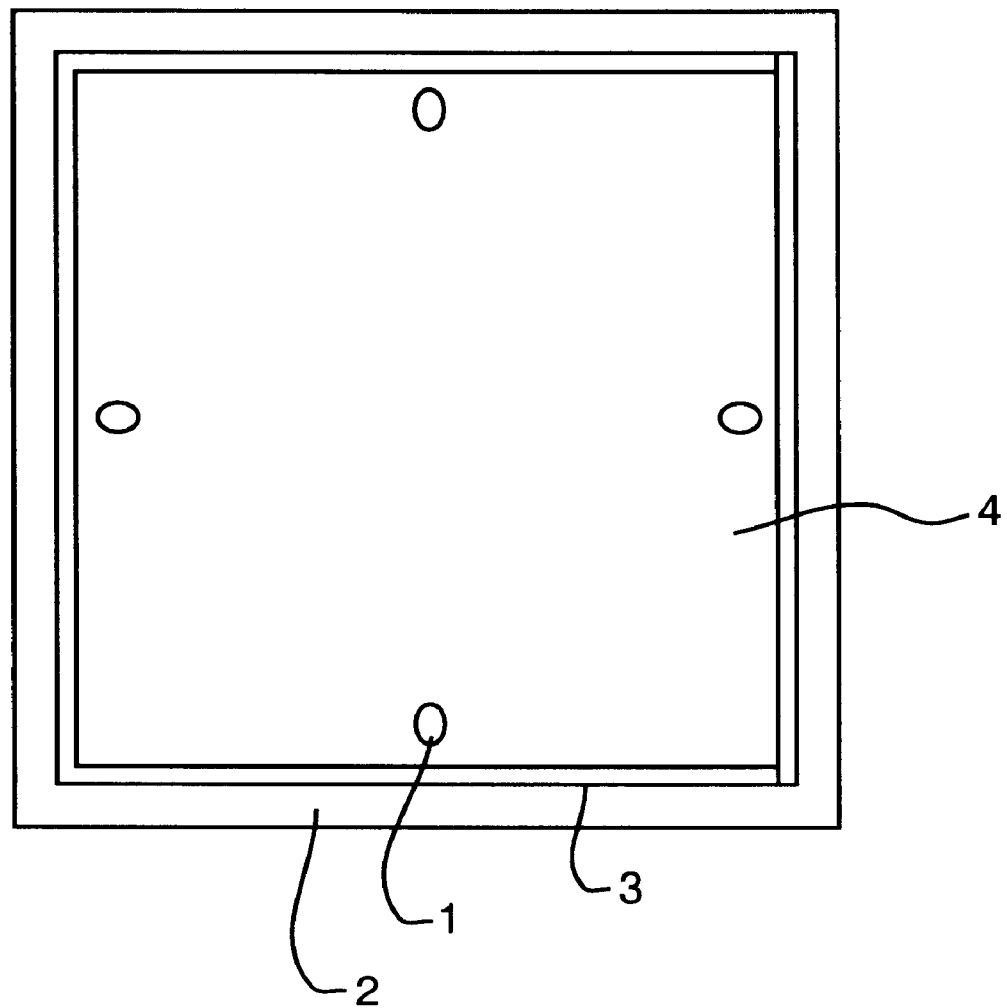
FIG. 1 is an illustration of the preferred embodiment of the invention.
Figure 2:
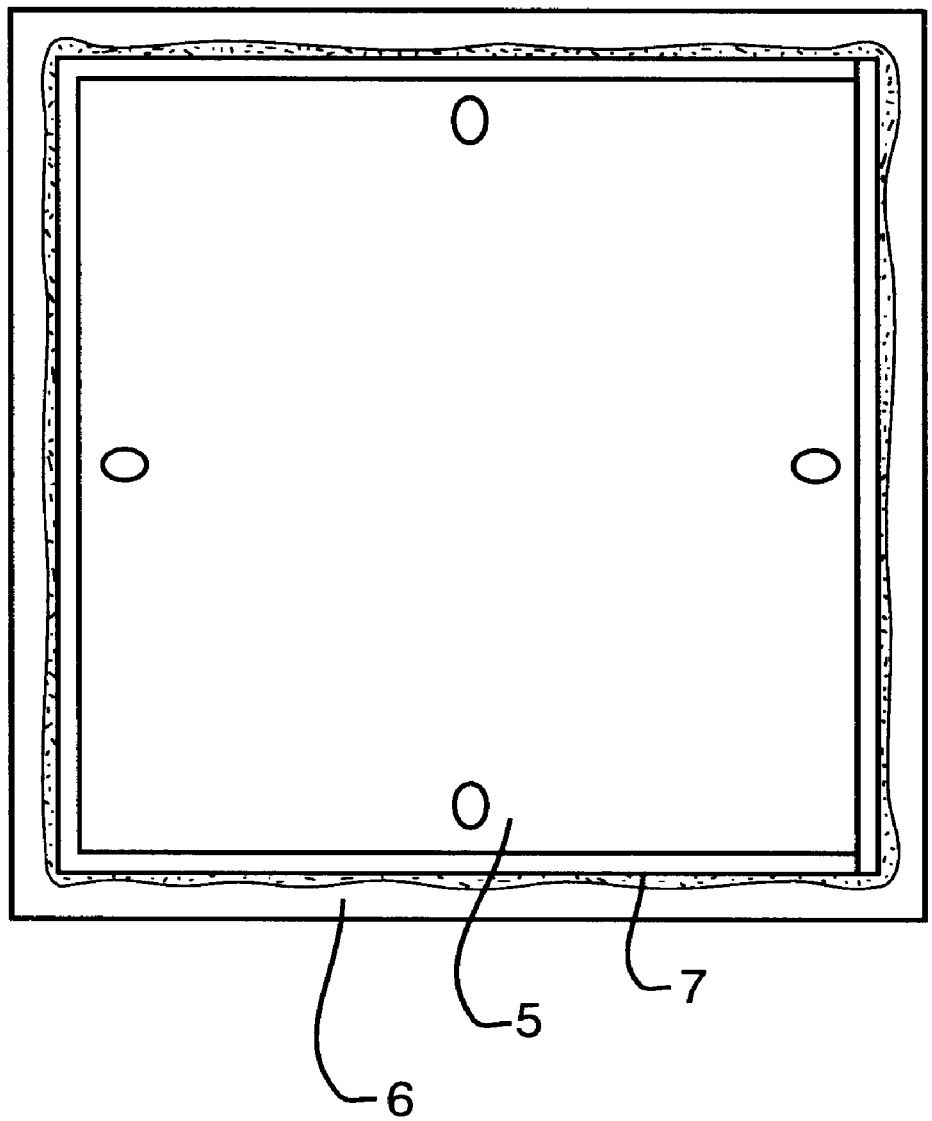
FIG. 2 is an illustration of the invention shown in FIG. 1 depicting the foil-covered separator after lamination.

FIGS. 1 and 2 demonstrate the technique.

FIG. 1 shows an aluminum separator 4 of a given size with registration slots 1, covered on both sides with an oversize copper foil 2. The two copper foils are then connected to each other at a point outside the surface of the separator sheet in such a way that the copper foil stands over a little 3.

FIG. 2 shows the foil-covered separator after lamination. The expanded aluminum sheet has broken through the joint 5. The underlying copper foil is perfectly laminated to the inner layers 6. The surplus epoxy resin sticks to the projecting edge of the copper foil 7.

Thus a new compound material has been invented that takes the properties of the individual components—different heat transition and thermal expansion values—into account.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A method for partially connecting copper foils of any given type and thickness with aluminum separators of any given alloy and thickness, as to be used in laminating multilayers, comprising the steps of:

placing a copper foil panel on both sides of the aluminum separator, each copper foil panel has projected edges wherein the copper foil panels are larger than the aluminum separator so that the copper foil panels project beyond the separator on all sides and lie flat on it, and fixing the oversize/projecting copper foil panels to each other by providing a plurality of fixation points by attachment of the projected edges of one of the copper foil panels with the projected edges of the other copper foil panel in such a manner that there is a free space between the fixation points and the aluminum separator to allow the separator to expand.

2. The method as per claim 1 further comprising the step of joining the two copper foil panels together with glue.

3. The method of claim 1 further comprising the step of punching a plurality of registration slots through said copper foil panels and aluminum separator.

4. The method of claim 1 further comprising the step of joining the two copper foil panels together by soldering.

5. The method of claim 1 further comprising the step of joining the two copper foil panels together by welding.

6. The method of claim 1 further comprising the step of joining the two copper foil panels together by punching.

7. The method of claim 1 further comprising the step of joining the two copper foil panels together by stamping.

* * * * *